United States Patent [19]

Okamura

[11] Patent Number: 5,483,540
[45] Date of Patent: Jan. 9, 1996

[54] DEMULTIPLEXER FOR DEMULTIPLEXING SERIAL MULTIPLEXED SIGNAL INTO BITS

[75] Inventor: Toshiyuki Okamura, Tokyo, Japan

[73] Assignee: NEC Corporation, Tokyo, Japan

[21] Appl. No.: 345,466

[22] Filed: Nov. 21, 1994

[30] Foreign Application Priority Data

Nov. 22, 1993 [JP] Japan .................................. 5-292154

[51] Int. Cl.$^6$ ...................................................... H04J 3/04
[52] U.S. Cl. ........................... 370/112; 327/295; 327/418
[58] Field of Search ............................ 370/112; 327/117, 327/415, 295, 418

[56] References Cited

U.S. PATENT DOCUMENTS

| 4,891,808 | 1/1990 | Williams | 370/112 |
|---|---|---|---|
| 4,926,423 | 5/1990 | Zukowski | 370/112 |
| 5,128,940 | 7/1992 | Wakimoto | 370/112 |
| 5,150,364 | 9/1992 | Negus | 370/112 |

FOREIGN PATENT DOCUMENTS 3-97329  4/1991  Japan .

Primary Examiner—Douglas W. Olms
Assistant Examiner—Ajit Patel
Attorney, Agent, or Firm—Foley & Lardner

[57] ABSTRACT

The invention provides a demultiplexer which does not require a reset circuit for setting initial values for outputs and can define a bit for each output terminal. Rising edges of delay outputs 8-1 to 11-1 from non-inverted output terminals Q of MS-DFFs (master-slave D-type flipflops) 6-1 to 6-4 are successively delayed in order of the cascade connection. After the outputs from output terminals Q are outputted, delay outputs 8-2 to 11-2 are outputted successively from the inverted output terminals of the MS-DFFs beginning with the inverted output terminal of MS-DFF 6-1 at the top. In a timed relationship with the timings of the delay outputs, MS-DFFs 4-1 to 4-4 and MSM-DFFs 5-1 go 5-4 extract corresponding input signals 12 to 19 from within multiplexed input signal 22. MS-DFFs 4-5 to 4-12 output input signals 12 to 19 at a same timing as demultiplexed outputs demultiplexed to 1:8.

3 Claims, 8 Drawing Sheets

DEMULTIPLEXER FOR DEMULTIPLEXING SERIAL MULTIPLEXED SIGNAL INTO BITS

BACKGROUND OF THE INVENTION

(1) Field of the Invention

This invention relates to a demultiplexer suitable for integration, and more particularly to a demultiplexer suitable for a high speed operation.

(2) Description of the Related Art

A demultiplexer suitable for a high speed operation is disclosed in Japanese Patent Laid-Open No. Hei 3-97329 (97329/91) wherein a plurality of basic circuits each in the form of a 1:2 demultiplexer circuit are combined to realize a $1:2^N$ demultiplexer. FIG. 1 shows a logic circuit diagram of a conventional 8-bit demultiplexer as an example. Reference numeral 71 denotes a data input terminal, 72 a clock input terminal, reference numerals 73-1, 73-2, . . . and 73-8 denote data output terminals, 74-1 and 74-2 denote ½ clock signals, 75-1 and 75-2 denote ¼ clock signals, 76-1 and 76-2 denote ⅛ clock signals, reference numeral 77 denotes a clock dividing circuit, 78 a master-slave D-type flipflop (hereinafter referred to as MS-DFF or further abbreviated as MS), and 79 a master-slave-master D-type flipflop (hereinafter referred to as MSM-DFF or further abbreviated as MSM).

Reference numeral 80 denotes a data input signal, reference numerals 81 and 82 denote demultiplexed signals demultiplexed to 1:2 from data input signal 80, 83 to 86 denote demultiplexed signals demultiplexed to 1:4 from data input signal 80, and 87 to 94 denote demultiplexed signal demultiplexed to 1:8 from data input signal 80.

An MSM-DFF is a flipflop including a current switch circuit connected in cascade connection to a conventional MS-DFF, and the output thereof is delayed by one half period of a clock signal as compared with the MS-DFF. The demultiplexer shown in FIG. 1 includes seven 1:2 demultiplexer circuits each having a basic construction including an MS-DFF and an MSM-DFF in pair and connected in a tree-like configuration to construct a 1:8 demultiplexer circuit.

Operation of the demultiplexer of FIG. 1 is described below with reference to a time chart shown in FIG. 2. First, an 8-bit multiplexed signal of data input signal 80 is latched as seen at signal 71' at a rising edge of clock signal 74-1 by the first stage MSM-DFF and then outputted at a falling edge of clock signal 74-1. Consequently, a demultiplexed signal is outputted for each odd-numbered bit as at signal 1, 3, 5, 7, . . . as seen from signal 81. Meanwhile, input signal 80 is latched at each rising edge of clock signal 74-2, which has a phase opposite to the phase of clock signal 74-1, by the first stage MS-DFF. Consequently, a demultiplexed signal is outputted for each even-numbered bit as at signal 2, 4, 6, 8, . . . as seen from signal 82. Thereafter, signal 81 is similarly demultiplexed for each 4 bits so as to obtain signals 1, 5, 1', 5', . . . indicated by signal 83 by one of the next stage MSM-DFFs and is demultiplexed for each 4 bits so as to obtain signals 3, 7, 3', 7', . . . indicated by signal 84 by one of the next stage MS-DFFs.

Then, thus demultiplexed 8-bit signals are outputted simultaneously. It is to be noted that the demultiplexed signals are outputted in accordance with their original time series of the original multiplexed signal from output signal terminals 73-1, 73-2, . . . and 73-8. In particular, the outputting order of the demultiplexed signals is defined such that the first bit in the time series is outputted to output terminal 73-1; the second bit is outputted to output terminal 73-2; . . . ; and the last bit in the time series is outputted to output terminal 73-8.

While the conventional demultiplexer can define the outputting order of demultiplexed signals, it is disadvantageous in that it cannot define output bits for the individual output terminals. In particular, since the first signal in a time series is not always the first bit in a frame constituted from 8 bits, it cannot be defined what numbered bit is outputted to output signal terminal 73-1. Therefore, in order to establish the condition wherein the first bit is outputted to output signal terminal 73-1, complicated post-processing must be applied to the outputs from the output signal terminals.

Further, the dividing circuit section of the 1:8 demultiplexer described as an example above requires, in order to prevent an error at any of the ½ division outputs, the ¼ division outputs and the ⅛ division outputs, a reset circuit for uniquely deciding logic initial values for the individual outputs. Accordingly, the conventional demultiplexer is disadvantageous also in that the reset circuit has a bad influence upon a high speed operation.

SUMMARY OF THE INVENTION

It is an object of the present invention to provide a demultiplexer which can define, for each output terminal, what numbered bit in a frame of a multiplexed signal is outputted and does not require a reset circuit for setting initial values for outputs.

According to the present invention, there is provided a demultiplexer which receives a basic clock signal and a multiplexed signal in which one frame is constituted from $2^N$ multiplexed bits which are serially sent to the demultiplexer in synchronism with the basic clock signal, demultiplexes the inputted multiplexed signal into individual bits and outputs $2^N$ bits at a same timing individually from $2^N$ output terminals, comprising a dividing delaying circuit for dividing the basic clock signal into a division clock signal of a $1/2^N$ frequency, delaying the divided clock signal within the range of one period of the divided clock signal in response to an instruction signal to obtain an internal clock signal and outputting the internal clock signal, a shift register including $2^N/2$ first master-slave D-type flipflops connected in cascade connection for passing the internal clock signal through the first master-slave D-type flipflops in synchronism with the basic clock signal to shift the internal clock signal in the shift register and outputting outputs at first and second logic output terminals of the first master-slave D-type flipflops as driving clock signals, $2^N/2$ second master-slave D-type flipflops each for receiving the multiplexed signal at a signal input terminal thereof and receiving, at a clock input terminal thereof, the driving clock signal from the first logic output terminal of a corresponding one of the first master-slave D-type flipflops of the shift register, $2^N/2$ master-slave-master D-type flipflops each constituted from a master-slave D-type flipflop and a current switch circuit connected in cascade connection to the master-slave D-type flipflop for receiving the multiplexed signal at a signal input terminal thereof and receiving, at a clock input terminal thereof, the driving clock signal from the second logic output terminal of a corresponding one of the first master-slave D-type flipflops of the shift register, and $2^N$ third master-slave D-type flipflops for individually receiving the outputs of the second master-slave D-type flipflops and the outputs of the master-slave-master D-type flipflops and outputting the inputted outputs as outputs demultiplexed to $1:2^N$ to the output terminals of the demultiplexer at a same timing.

Preferably, the dividing delaying circuit includes a dividing circuit for dividing the basic clock signal into a divided clock signal of a $1/2^N$ frequency, a 2:1 selector for selecting a non-inverted output or an inverted output of the dividing circuit in response to a first instruction signal, buffer gates connected in cascade connection for receiving an output of the 2:1 selector and generally delaying the inputted output of the 2:1 selector within the range of one half period of the divided clock signal, and an N:1 selector for selectively outputting an output of one of the buffer gates in response to a second instruction signal.

Preferably, the dividing delaying circuit includes a dividing circuit for dividing the basic clock signal into a divided clock signal of a $1/2^N$ frequency, a 2:1 selector for selecting a non-inverted output or an inverted output of the dividing circuit in response to a first instruction signal, $2^N/2$ master-slave D-type flipflops connected in cascade connection for receiving an output of the 2:1 selector and generally delaying the inputted output of the 2:1 selector within the range of one half period of the divided clock signal, and an $2^N/2:1$ selector for selectively outputting an output of one of the $2^N/2$ master-slave D-type flipflops in response to a second instruction signal.

In the shift register to which the internal clock signal is inputted from the dividing delaying circuit, the inputted internal clock signal is shifted in synchronism with the basic clock signal by the first master-slave D-type flipflops. The first master-slave D-type flipflops output outputs at the first and second logic output terminals thereof as driving clock signals to the second master-slave D-type flipflops or master-slave-master D-type flipflops.

The $2^N/2$ second master-slave D-type flipflops and the $2^N/2$ master-slave-master D-type flipflops extract corresponding bits from within the inputted multiplexed signal in a timed relationship with the timings of the driving clock signals inputted thereto.

The bits extracted by the $2^N/2$ second master-slave D-type flipflops and the $2^N/2$ master-slave-master D-type flipflops are outputted individually at a same timing as outputs demultiplexed to $1:2^N$ from the $2^N$ third master-slave D-type flipflops.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENTS

Figure 1:
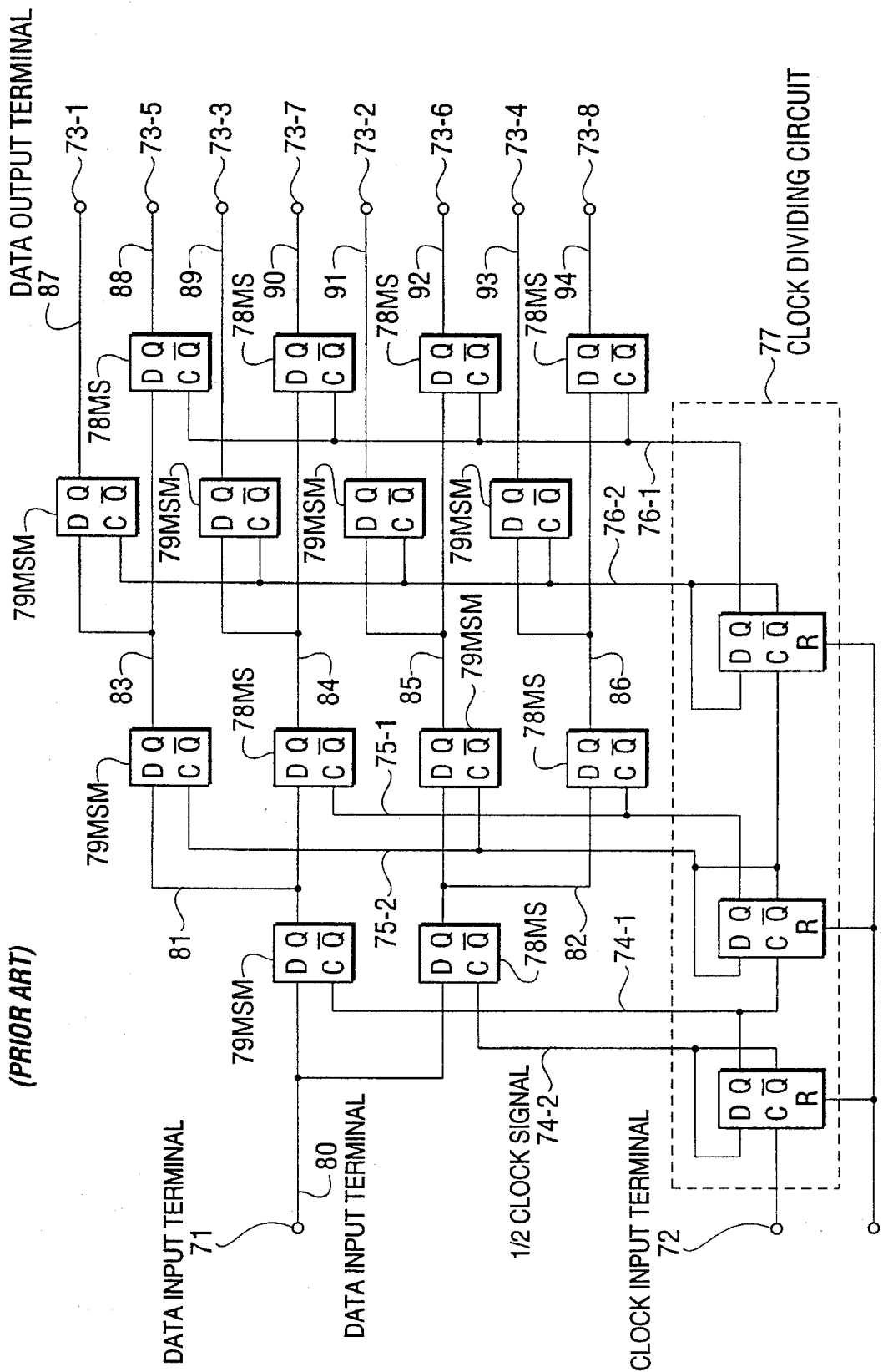
FIG. 1 is a logic circuit diagram showing a conventional 8-bit demultiplexer.
Figure 2:
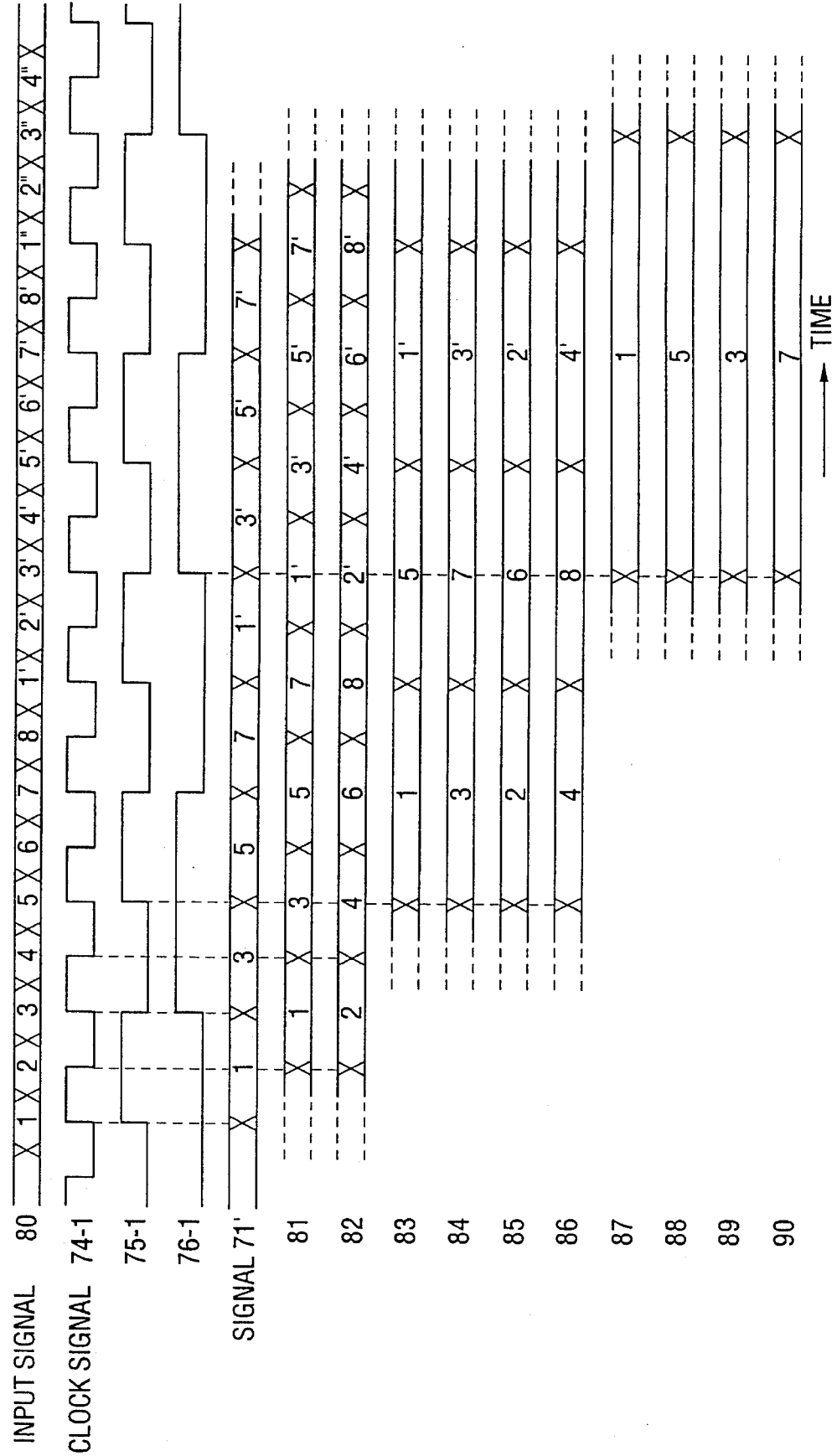
FIG. 2 is a time chart illustrating operation of the conventional 8-bit demultiplexer of FIG. 1.
Figure 3:
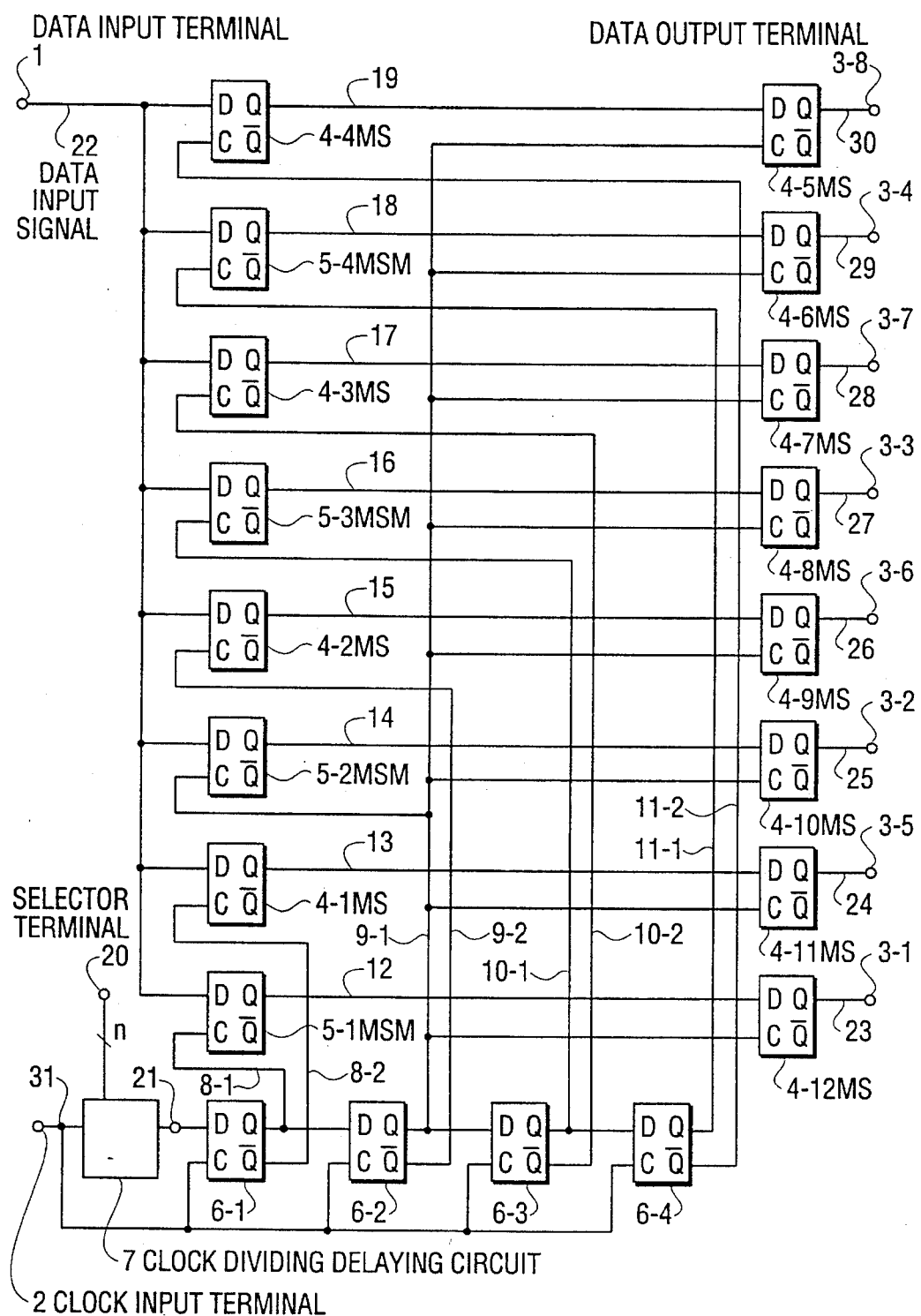
FIG. 3 is a logic circuit diagram showing a first embodiment of a demultiplexer of the present invention.
Figure 4:
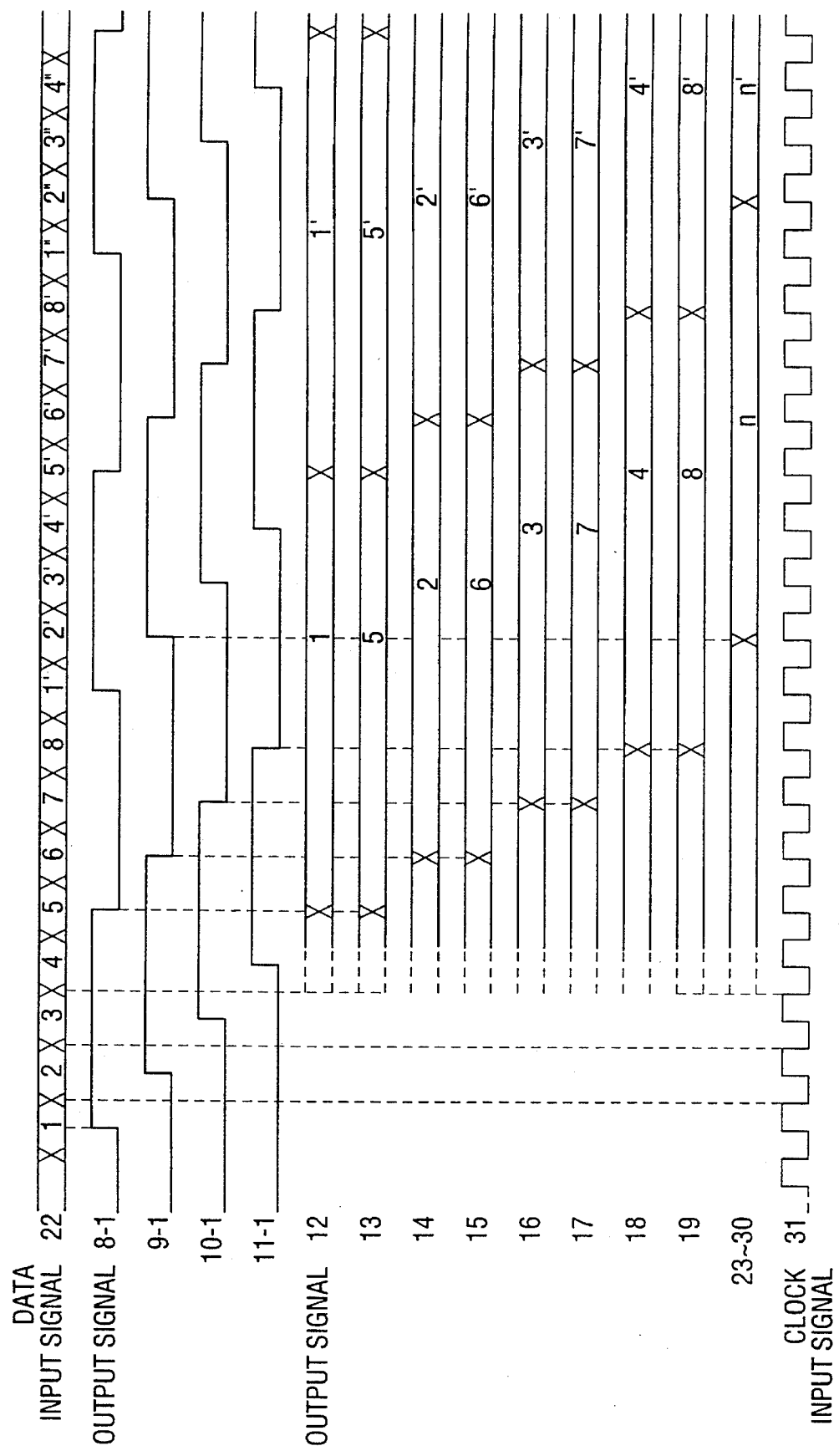
FIG. 4 is a time chart illustrating operation of the embodiment of FIG. 3.

An embodiment of the present invention is described below with reference to the drawings. FIG. 3 is a logic circuit diagram showing an embodiment of a demultiplexer of the present invention, and FIG. 4 is a time chart illustrating operation of the embodiment of FIG. 3. Reference numeral 1 denotes a data input terminal, 2 a clock input terminal, reference numerals 3-1, 3-2, . . . and 3-8 denote data output terminals, and reference numeral 20 denotes a selector terminal. Reference numerals 4-1, 4-2, 4-3 and 4-4 each denote a master-slave D-type flipflop (hereinafter referred to as MS-DFF and, in the drawings, abbreviated as MS), and 5-1, 5-2, 5-3 and 5-4 each denote a master-slave-master D-type flipflop (hereinafter referred to as MSM-DFF and, in the drawings, abbreviated as MSM). Further, reference numerals 4-5, 4-6, . . . and 4-12 denote MS-DFFs each having non-inverted output terminal Q connected to an individual data output terminal.

It is to be noted that an MSM-DFF is a flipflop constituted from a current switch circuit connected in cascade connection to a conventional MS-DFF and the output thereof is delayed by one half period of a clock signal as compared with the conventional MS-DFF.

Reference numerals 6-1, 6-2, 6-3 and 6-4 each denote a D-type flipflop (hereinafter referred to as DFF) having two non-inverted and inverted outputs, and reference numeral 7 denotes a clock dividing delaying circuit. Reference numeral 22 denotes a data input signal, 31 a clock input signal, and reference numerals 8-1, 8-2, 9-1, 9-2, 10-1, 10-2, 11-1 and 11-2 denote output signals of a 4-bit shift register constituted from MS-DFFs 6-1, 6-2, 6-3 and 6-4. Reference numerals 13, 15, 17 and 19 denote output signals of MS-DFFs 4-1, 4-2, 4-3 and 4-4, respectively, and 12, 14, 16 and 18 denote output signals of MSM-DFFs 5-1, 5-2, 5-3 and 5-4, respectively. Those signals 12 to 19 are demultiplexed signals demultiplexed to 1:8.

Figure 5:
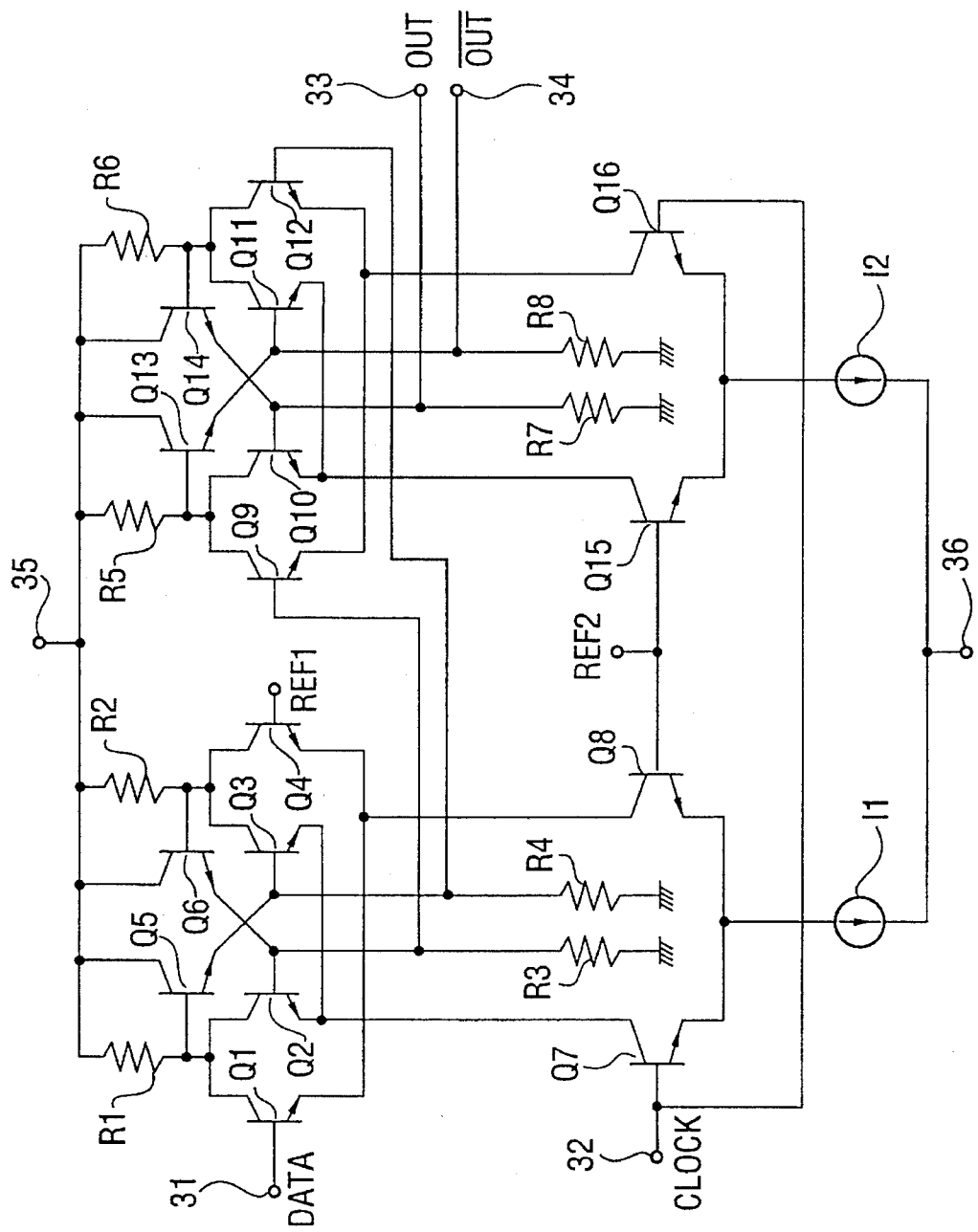
FIG. 5 is a circuit diagram showing a concrete example of an MS-DFF in the embodiment of FIG. 3.
Figure 6:
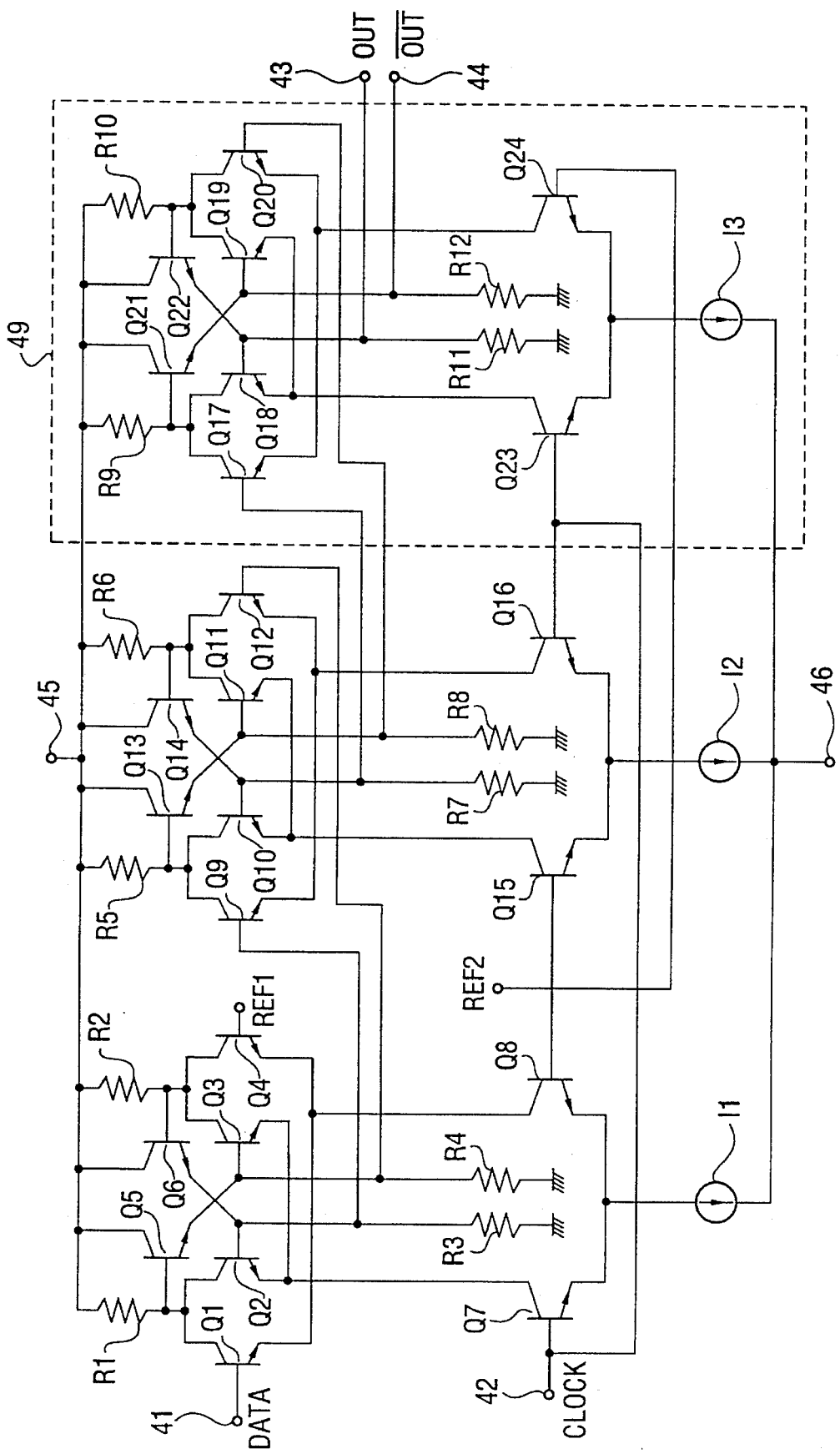
FIG. 6 is a circuit diagram showing a concrete example of an MSM-DFF in the embodiment of FIG. 3.

FIG. 5 shows a circuit example of an MS-DFF wherein it is constituted from bipolar elements, and FIG. 6 shows a circuit example of an MSM-DFF wherein it is constituted from bipolar elements. The MS-DFF of FIG. 5 is supplied with power from power source terminals 35 and 36, receives a data input signal at input terminal 31, receives a clock signal at clock input terminal 32, and outputs a non-inverted output and an inverted output from output terminals 33 and 34, respectively. The MSM-DFF of FIG. 6 is supplied with power from power source terminals 45 and 46, receives a data input signal at input terminal 41, receives a clock signal at clock input terminal 42, and outputs a non-inverted output and an inverted output from output terminals 43 and 44, respectively. The MSM-DFF has a circuit configuration which includes current switch circuit 49 in addition to an MS-DFF.

Figure 7:
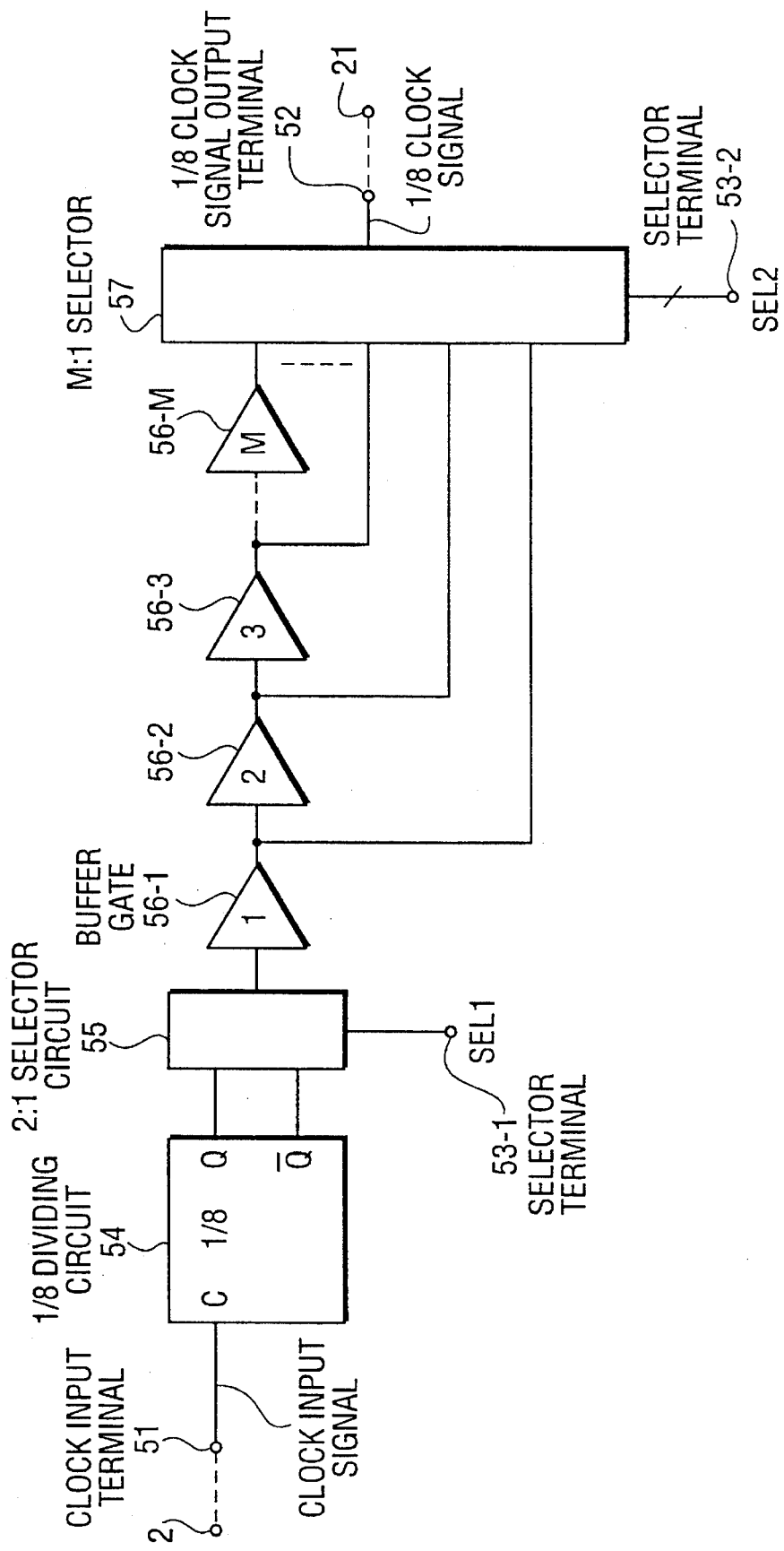
FIG. 7 is a block diagram showing a first concrete example of a dividing delaying circuit in the embodiment of FIG. 3.

FIG. 7 shows a first concrete example of the dividing delaying circuit. Referring to FIG. 7, reference numeral 51 denotes a clock input terminal, which is connected to clock input terminal 2 of FIG. 3. Reference numeral 52 denotes a ⅛ clock signal output terminal, which is connected to terminal 21 of FIG. 3. Reference numerals 53-1 and 53-2 denote selector terminals. Selector terminals 53-1 and 53-2 are represented as selector terminal 20 in FIG. 3. Reference numeral 54 denotes a ⅛ dividing circuit, 55 a 2:1 selector circuit, reference numerals 56-1, 56-2, 56-3, . . . and 56-M denote buffer gates, and reference numeral 57 denote an M:1 selector.

Operation of the demultiplexer in which the dividing delaying circuit of the first concrete example shown in FIG. 7 is incorporated is described below. The basic clock signal indicated by clock signal 31 in FIGS. 3 and 4 is inputted to ⅛ dividing circuit 54 shown in FIG. 7, and a ⅛ divided output is outputted from ⅛ dividing circuit 54. In this instance, switching between the noninverted output and the inverted output of ⅛ dividing circuit 54 by 2:1 selector 55 is performed in response to signal SEL1 from selector terminal 53-1 shown in FIG. 7 to control delaying of the basic clock signal by a time for four periods. The output which has been delayed by a time for four periods is controlled to be delayed with a delay amount smaller than one period of the basic clock signal in response to signal SEL2 from selector terminal 53-2 by N:1 selector circuit 57, which switches the delay amount depending upon the output of which one of the buffer gates should be selected in response to signal SEL2, and is outputted as a ⅛ clock signal to terminal 21.

The gate delay amount by delay control is about 40 ps with a device whose maximum cutoff frequency ($f_T$) is 30 GHz, and can be obtained with a 20:1 selector circuit having 20 stages of gates where the operation speed is based on a basic clock signal of 5 GHz. The ⅛ clock signal is shifted by one to four periods of the basic clock signal by the four-bit shift register constituted MS-DFFs 6-1, 6-2, 6-3 and 6-4 to obtain signals 8-1, 8-2, 9-1, 9-2, 10-1, 10-2, 11-1 and 11-2 to be outputted from the four-bit shift register.

Then, data at the first bit of data input signal 22 of FIG. 4 indicated by signal 1 is latched at a rising edge of clock signal 8-1 by MSM-DFF 5-1 of FIG. 3 and is outputted at a falling edge of clock signal 8-1 as indicated by signal 12 in FIG. 4. Further, MS-DFF 4-1 shown in FIG. 3 outputs data at the fifth bit at a rising edge of clock signal 8-2 (it is to be noted that clock signals 8-2, 9-2, 10-2 and 11-2 are not shown in FIG. 4 since they can be gathered readily from clock signals 8-1, 9-1, 10-1 and 11-1, respectively) as indicated by signal 13 of FIG. 4. Similarly, data at the second bit is outputted as indicated by signal 14 in response to clock signal 9-1, and data at the sixth bit is outputted in response to clock signal 9-2. Thereafter, data at the third, fourth, seventh and eighth bits are outputted as indicated by signals 16 to 19 of FIG. 4, respectively. Finally, the data outputs of 8 bits are re-timed at a rising edge of clock signal 9-1 so that they are outputted as demultiplexed signals demultiplexed to 1:8 at the same timing as indicated by signals 23 to 30.

In this instance, the output bits of signals 23 to 30 are checked, and the first bit is positioned by controlling selector terminals SEL1 and SEL2 shown in FIG. 7 in accordance with a result of the check. The positioning may be performed by a method wherein serial data having input logic values of, for example, 10000000 is inputted to data input terminal 1 and signals SEL1 and SEL2 are controlled so that the logic of 1 is outputted at data output terminal 3-1.

It is to be noted that, since DFFs 61-1 to 6-4 employed in the present embodiment do not have a built-in reset circuit and accordingly do not include excessive elements as much, the DFFs can operate at a higher speed. Further, by modifying the demultiplexer of the present embodiment such that the dividing ratio is changed to $1/2^N$ and the shift register (6-1 to 6-4) is provided by $2^N/2$ while the MS-DFF and the MSM-DFF connected to data input terminal 1 are each provided by $2^N/2$, a 1:$2^N$ demultiplexer circuit can advantageously be constructed readily.

Figure 8:
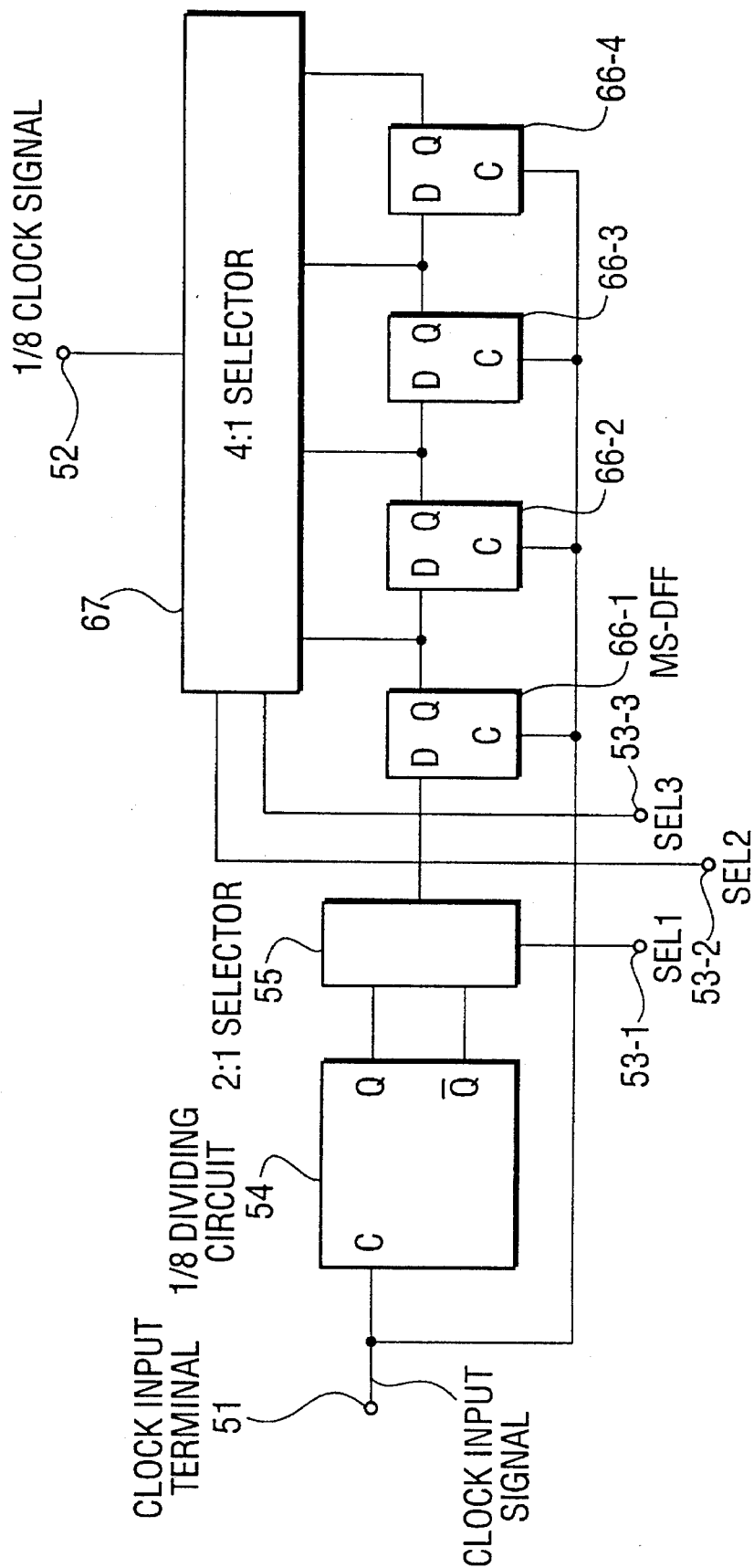
FIG. 8 is a block diagram showing a second concrete example of the dividing delaying circuit in the embodiment of FIG. 3.

Next, the second embodiment of the present invention is described with reference to FIG. 8. FIG. 8 shows a second concrete example of the dividing delaying circuit. Reference numeral 51 denotes a clock input terminal, which is connected to clock input terminal 2 of FIG. 3. Reference numeral 52 denotes an output terminal of a ⅛ clock signal, which is connected to terminal 21 of FIG. 3. Reference numerals 53-1, 53-2 and 53-3 denotes selector terminals, which are connected to terminal 20 of FIG. 3. Reference numeral 54 denotes a ⅛ dividing circuit, 55 a 2:1 selector, and reference numerals 66-1, 66-2, 66-3 and 66-4 denote MS-DFFs which constitute a 4-bit shift register, and reference numeral 67 denotes a 4:1 selector.

The second embodiment in which the dividing delaying circuit of FIG. 8 is incorporated is described below. A basic clock signal inputted from clock input terminal 51 of FIG. 8 is inputted to ⅛ dividing circuit 54. The output of ⅛ dividing circuit 54 is controlled to be delayed by a time for four periods of the basic clock signal by 2:1 selector 55 similarly as in the first embodiment. The output of 2:1 selector 55 is inputted to the 4-bit shift register constituted from MS-DFFs 66-1, 66-2, 66-3 and 66-4, each of which has clock terminal C to which the basic clock signal is inputted, and the outputs of the four-bit shift register are switched by the 4:1 selector to realize delay control for one to eight periods of the basic clock signal. Further, the demultiplexer of the second embodiment is characterized in that, as compared with the demultiplexer of the first embodiment, the bit control can be performed accurately and need not be varied in response to the input frequency. Since the demultiplexing method of the demultiplexer of the present embodiment is same as that of the first embodiment, overlapping description of the demultiplexing method is omitted herein.

As described above, since the demultiplexer according to the present invention comprises $2^N/2$ master-slave D-type flipflops for receiving a multiplexed data input signal and receiving, as a clock input thereto, the outputs of master-slave D-type flipflops of a shift register and $2^N/2$ master-slave-master D-type flipflops each constituted from a master-slave D-type flipflop and a current switch circuit connected in cascade connection to the master-slave D-type flipflop, the demultiplexer can demultiplex without provision of a reset circuit. Further, since a selector for outputting a plurality of clocks having suitable delay amounts in a suitable order is provided in a dividing delaying circuit which provides a clock signal to the shift register, it can be defined what numbered bit in a frame of a multiplexed signal is outputted at each output terminal.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A demultiplexer which receives a basic clock signal and a multiplexed signal having one frame including $2^N$ multiplexed bits which are serially sent to said demultiplexer in synchronism with the basic clock signal, demultiplexes the received multiplexed signal into individual bits and outputs $2^N$ bits in parallel from $2^N$ output terminals, said demultiplexer comprising:

a dividing delaying circuit for dividing the basic clock signal into a divided clock signal of a ½$^N$ frequency, delaying the divided clock signal within a range of one period of the divided clock signal in response to an instruction signal to obtain an internal clock signal and outputting the internal clock signal;

a shift register including $2^n/2$ first master-slave D-type flipflops connected in cascade connection for passing the internal clock signal through said $2^n/2$ first master-slave D-type flipflops in synchronism with the basic clock signal to shift the internal clock signal in said shift register and outputting driving clock signals at first and second logic output terminals of said $2^N/2$ first master-slave D-type flipflops;

$2^N/2$ second master-slave D-type flipflops each for receiving the multiplexed signal at a signal input terminal thereof and receiving, at a clock input terminal thereof, the driving clock signal from the first logic output terminal of a corresponding one of said $2^N/2$ first master-slave D-type flipflops of said shift register;

$2^N/2$ master-slave-master D-type flipflops having a master-slave D-type flipflop and a current switch circuit, said current switch circuit connected to the master-slave D-type flipflop for receiving the multiplexed signal at a signal input terminal thereof and receiving, at a clock input terminal thereof, the driving clock signal from the second logic output terminal of a corresponding one of said first master-slave D-type flipflops of said shift register; and $2^N$ third master-slave D-type flipflops for individually receiving the outputs of said second master-slave D-type flipflops and the outputs of said master-slave-master D-type flipflops and outputting the inputted outputs as outputs demultiplexed to $1:2^N$ to said output terminals of said demultiplexer.

2. A demultiplexer as claimed in claim 1, wherein said dividing delaying circuit includes a dividing circuit for dividing the basic clock signal into a divided clock signal of a $½^N$ frequency, a 2:1 selector for selecting a non-inverted output or an inverted output of said dividing circuit in response to a first instruction signal, buffer gates connected in cascade connection for receiving an output of said 2:1 selector and generally delaying the received output of said 2:1 selector within the range of one half period of the divided clock signal, and a selector for selectively outputting an output of one of said buffer gates in response to a second instruction signal.

3. A demultiplexer as claimed in claim 1, wherein said dividing delaying circuit includes a dividing circuit for dividing the basic clock signal into a divided clock signal of a $½^N$ frequency, a 2:1 selector for selecting a non-inverted output or an inverted output of said dividing circuit in response to a first instruction signal, $2^N/2$ master-slave D-type flipflops connected in cascade connection for receiving an output of said 2:1 selector and generally delaying the inputted output of said 2:1 selector within the range of one half period of the divided clock signal, and an $2^{N/2:1}$ selector for selectively outputting an output of one of said $2^N/2$ master-slave D-type flipflops in response to a second instruction signal.

* * * * *